US011283400B2

(12) United States Patent
Fischer

(10) Patent No.: US 11,283,400 B2
(45) Date of Patent: Mar. 22, 2022

(54) SOLAR ENERGY SYSTEM

(71) Applicant: TYLL Solar, LLC, Rochester, NY (US)

(72) Inventor: Jay D. Fischer, Flemington, NJ (US)

(73) Assignee: TYLL SOLAR, LLC, Rochester, NY (US)

(*) Notice: Subject to any disclaimer, the term of this patent is extended or adjusted under 35 U.S.C. 154(b) by 129 days.

(21) Appl. No.: 16/536,710

(22) Filed: Aug. 9, 2019

(65) Prior Publication Data
US 2020/0052646 A1 Feb. 13, 2020

Related U.S. Application Data

(60) Provisional application No. 62/717,830, filed on Aug. 11, 2018.

(51) Int. Cl.
*H02S 40/44* (2014.01)
*H02S 20/23* (2014.01)
*H02S 40/42* (2014.01)
*F24S 10/50* (2018.01)
*F24S 25/20* (2018.01)
*F24S 70/12* (2018.01)

(52) U.S. Cl.
CPC ............ *H02S 40/44* (2014.12); *F24S 10/502* (2018.05); *F24S 25/20* (2018.05); *F24S 70/12* (2018.05); *H02S 20/23* (2014.12); *H02S 40/425* (2014.12)

(58) Field of Classification Search
CPC ........ H02S 40/44; H02S 40/425; H02S 40/42; H01L 31/0521
See application file for complete search history.

(56) References Cited

U.S. PATENT DOCUMENTS 314,945 A    3/1885   Köring
659,450 A   10/1900   McHenry
(Continued)

FOREIGN PATENT DOCUMENTS

CN    103174866 A    6/2013
CN    103262262 A    8/2013
(Continued)

OTHER PUBLICATIONS

Zhu, Changlin et al., "Numerical Study of Interactions of Vortices Generated by Vortex Generators and Their Effects on Heat Transfer Enhancement", Numerical Heat Transfer, Part A, 50: pp. 345-360, 2006.

(Continued)

*Primary Examiner* — Daniel P Malley, Jr.
(74) *Attorney, Agent, or Firm* — Hoffmann & Baron, LLP

(57) ABSTRACT

A modular, solar energy system comprising one or more modular solar panels. The solar panels include a pair of general planar, plates that are secured together to form a narrow channel therebetween for the circulation of a liquid. The solar panels have inlet and outlet fluid lines in fluid communication via manifolds with a cold fluid supply line and a warm fluid return line, respectively. The plates are preferably constructed of aluminum and one plate has a photovoltaic cell matrix affixed thereto to face the sun. The plates have dividers or partitions that enhance the heat transfer characteristics with respect to the liquid flowing though the channel between the plates.

16 Claims, 14 Drawing Sheets

(56) References Cited

U.S. PATENT DOCUMENTS

| | | |
|---|---|---|
| 695,136 A | 3/1902 | Baker |
| 991,161 A | 5/1911 | McHenry et al. |
| 1,784,511 A | 12/1930 | Carns et al. |
| 2,146,845 A | 2/1939 | Payne |
| 2,427,262 A | 9/1947 | Delano et al. |
| 2,448,648 A | 9/1948 | Zideck et al. |
| 2,680,437 A | 6/1954 | Miller |
| 2,969,586 A | 1/1961 | Victor et al. |
| 3,076,450 A | 2/1963 | Gough et al. |
| 3,145,707 A | 8/1964 | Thomason et al. |
| 3,215,134 A | 11/1965 | Thomason et al. |
| 3,399,664 A | 9/1968 | Suhay et al. |
| 3,513,828 A | 5/1970 | Masters et al. |
| 3,893,506 A | 7/1975 | Laing |
| 3,918,430 A | 11/1975 | Stout et al. |
| 3,946,944 A | 3/1976 | Keyes et al. |
| 3,954,097 A | 5/1976 | Wilson, Jr. |
| 3,965,887 A | 6/1976 | Gramer et al. |
| 3,995,615 A | 12/1976 | Hojnowski et al. |
| 4,007,728 A | 2/1977 | Guba et al. |
| 4,029,080 A | 6/1977 | Warren et al. |
| 4,031,881 A | 6/1977 | Thiel et al. |
| 4,036,209 A | 7/1977 | Press et al. |
| 4,037,583 A | 7/1977 | Bakun et al. |
| 4,038,967 A | 8/1977 | Stout et al. |
| 4,055,163 A | 10/1977 | Costello et al. |
| 4,062,350 A | 12/1977 | Reed et al. |
| 4,062,351 A | 12/1977 | Hastwell et al. |
| 4,063,547 A | 12/1977 | Gruettner et al. |
| 4,076,013 A | 2/1978 | Bette |
| 4,076,015 A | 2/1978 | Mattson et al. |
| 4,077,393 A | 3/1978 | Mattson et al. |
| 4,079,726 A | 3/1978 | Voelker |
| 4,085,731 A | 4/1978 | Weir |
| 4,092,977 A | 6/1978 | Gurtler et al. |
| 4,094,300 A | 6/1978 | Young |
| 4,098,262 A | 7/1978 | Peters et al. |
| 4,106,479 A | 8/1978 | Rogers et al. |
| 4,111,186 A | 9/1978 | Ross et al. |
| 4,112,922 A | 9/1978 | Skinner et al. |
| 4,117,831 A | 10/1978 | Bansal et al. |
| 4,124,066 A | 11/1978 | Taylor |
| 4,128,095 A | 12/1978 | Oren, III et al. |
| 4,135,490 A | 1/1979 | Soleau, Jr. et al. |
| 4,136,675 A | 1/1979 | Karasick et al. |
| 4,137,899 A | 2/1979 | Weslow et al. |
| 4,138,991 A | 2/1979 | Lorenz et al. |
| 4,150,661 A | 4/1979 | Trimboli Callegari et al. |
| 4,151,830 A | 5/1979 | Crombie et al. |
| 4,153,037 A | 5/1979 | Isaacson |
| 4,154,222 A | 5/1979 | Yu et al. |
| 4,159,709 A | 7/1979 | Palazzetti et al. |
| 4,161,170 A | 7/1979 | Nicolaisen et al. |
| 4,161,809 A | 7/1979 | Severson et al. |
| 4,165,735 A | 8/1979 | Smith et al. |
| 4,170,220 A | 10/1979 | Smith et al. |
| 4,205,662 A | 6/1980 | Rhodes et al. |
| 4,210,122 A | 7/1980 | Artweger |
| 4,223,665 A | 9/1980 | Lowe et al. |
| 4,237,865 A | 12/1980 | Lorenz |
| 4,243,021 A | 1/1981 | Homsy et al. |
| 4,245,619 A | 1/1981 | Ogilvie et al. |
| 4,248,212 A | 2/1981 | Stevens et al. |
| 4,266,531 A | 5/1981 | Behrendt et al. |
| 4,278,074 A | 7/1981 | Uroshevich et al. |
| 4,279,240 A | 7/1981 | Artusy |
| 4,287,876 A | 9/1981 | Jacques et al. |
| 4,290,412 A | 9/1981 | Krauss et al. |
| 4,292,958 A | 10/1981 | Lee |
| 4,299,202 A | 11/1981 | Mayo et al. |
| 4,313,421 A | 2/1982 | Trihey |
| 4,319,559 A | 3/1982 | Hermann et al. |
| 4,327,708 A | 5/1982 | Taylor |
| 4,343,297 A | 8/1982 | Figge et al. |
| 4,345,586 A | 8/1982 | Monjes |
| 4,347,093 A | 8/1982 | Mayo et al. |
| 4,348,442 A | 9/1982 | Figge et al. |
| 4,369,210 A | 1/1983 | Sakamoto et al. |
| 4,378,784 A | 4/1983 | Frank |
| 4,383,959 A | 5/1983 | Sadler et al. |
| 4,404,958 A | 9/1983 | Boettcher et al. |
| 4,454,863 A | 6/1984 | Brown et al. |
| 4,457,298 A | 7/1984 | Eubank et al. |
| 4,473,064 A | 9/1984 | Jacques et al. |
| 4,473,066 A | 9/1984 | Clark |
| 4,526,225 A | 7/1985 | Stanton |
| 4,574,876 A | 3/1986 | Aid et al. |
| 4,660,545 A | 4/1987 | Ely et al. |
| 4,731,072 A | 3/1988 | Aid et al. |
| 4,737,140 A | 4/1988 | Lee et al. |
| 4,777,935 A | 10/1988 | Fricker |
| 4,858,594 A | 8/1989 | McCurdy |
| 4,979,331 A | 12/1990 | Tanaka et al. |
| 4,993,202 A | 2/1991 | Thiel et al. |
| 5,056,505 A | 10/1991 | Warwick et al. |
| 5,080,166 A | 1/1992 | Haugeneder et al. |
| 5,161,520 A | 11/1992 | Pitt et al. |
| 5,275,237 A | 1/1994 | Rolfson et al. |
| 5,323,763 A | 6/1994 | Lechner et al. |
| 5,911,205 A | 6/1999 | Gambardella |
| 5,944,010 A | 8/1999 | Hoffschmidt et al. |
| 6,082,353 A | 7/2000 | van Doorn |
| 6,837,236 B1 | 1/2005 | Lichtenberger |
| 6,939,599 B2 | 9/2005 | Clark et al. |
| 6,943,678 B2 | 9/2005 | Muirhead et al. |
| 7,752,980 B2 | 7/2010 | Muirhead et al. |
| 7,804,400 B2 | 9/2010 | Muirhead et al. |
| 8,474,177 B2 | 7/2013 | Griessen et al. |
| 8,585,850 B2 | 11/2013 | Muirhead et al. |
| 8,640,688 B2 | 2/2014 | Kelly et al. |
| 8,757,144 B2 | 6/2014 | Lalive et al. |
| 9,236,515 B2 | 1/2016 | Brottier et al. |
| 9,297,164 B2 | 3/2016 | Collins et al. |
| 9,731,474 B2 | 8/2017 | Pereira Da Cunha Ribeiro Valente et al. |
| 9,829,215 B2 | 11/2017 | Olalde et al. |
| 2008/0248737 A1 | 10/2008 | Liu et al. |
| 2008/0289622 A1 | 11/2008 | Liu et al. |
| 2009/0025709 A1 | 1/2009 | Bogdan et al. |
| 2009/0084430 A1 | 4/2009 | Intrieri et al. |
| 2010/0018569 A1* | 1/2010 | Mitchell ............ F24S 20/69 136/246 |
| 2010/0132696 A1 | 6/2010 | Lemaire |
| 2010/0153312 A1 | 6/2010 | Lemaire |
| 2010/0224234 A1* | 9/2010 | Fischer ............ F24D 11/0221 136/248 |
| 2011/0011087 A1 | 1/2011 | Sorensen et al. |
| 2011/0088753 A1 | 4/2011 | Ahlgren et al. |
| 2011/0192393 A1 | 8/2011 | Swift et al. |
| 2011/0197943 A1 | 8/2011 | Pleva et al. |
| 2011/0259402 A1 | 10/2011 | Schultz |
| 2012/0129443 A1 | 5/2012 | Bastow |
| 2012/0145223 A1 | 6/2012 | Weekley |
| 2012/0222670 A1 | 9/2012 | Dolphin et al. |
| 2012/0260909 A1 | 10/2012 | Olalde et al. |
| 2013/0112156 A1 | 5/2013 | Band et al. |
| 2013/0118479 A1 | 5/2013 | Fourmigue et al. |
| 2013/0220310 A1 | 8/2013 | Gregory et al. |
| 2013/0228167 A1 | 9/2013 | Lemaire et al. |
| 2013/0333310 A1 | 12/2013 | Damo |
| 2014/0007919 A1 | 1/2014 | Brottier et al. |
| 2014/0338657 A1 | 11/2014 | Marciel Filhno |
| 2015/0020793 A1 | 1/2015 | Llorente Folch et al. |
| 2015/0059277 A1 | 3/2015 | Collins et al. |
| 2015/0090432 A1 | 4/2015 | Féron et al. |
| 2016/0049902 A1 | 2/2016 | Cristi Gonzalez et al. |
| 2016/0238281 A1 | 8/2016 | Chibizov Chibizov et al. |
| 2017/0133974 A1 | 5/2017 | Safir |

(56) References Cited

U.S. PATENT DOCUMENTS

2018/0234050 A1* 8/2018 Schultz ................ H01L 31/048
2019/0056147 A1    2/2019 Brisebois

FOREIGN PATENT DOCUMENTS

| ES | 2433257 A1 | 12/2013 | |
|---|---|---|---|
| JP | H11-159890 A | 6/1999 | |
| JP | 2002-130977 A | 5/2002 | |
| WO | 93/15368 A1 | 8/1993 | |
| WO | 2004/083556 A1 | 9/2004 | |
| WO | 2010/129878 A2 | 11/2010 | |
| WO | 2012/154123 A1 | 11/2012 | |
| WO | 2012/166786 A2 | 12/2012 | |
| WO | 2016/004276 A9 | 1/2016 | |
| WO | WO-2016004276 A2 * | 1/2016 | ............ F24S 20/67 |
| WO | 2016/065045 A1 | 4/2016 | |

OTHER PUBLICATIONS

Office Action, Japanese Patent Application No. 2017-525509, dated Feb. 25, 2020, 10 pages.
PCT Search Report and Written Opinion, International Application No. PCT/US2019/045921, dated Nov. 26, 2019.

* cited by examiner

SOLAR ENERGY SYSTEM

CROSS-REFERENCE TO RELATED APPLICATIONS

This application claims the benefit of U.S. Provisional Application No. 62/717,830, filed Aug. 11, 2018, the contents of which are incorporated herein by reference.

FIELD OF THE INVENTION

The present invention is in the technical field of solar energy and, more particularly, the present invention is in the technical field of solar energy systems using solar panels for generating heat, hot water and/or electricity.

BACKGROUND OF THE INVENTION

There are, at the present, solar energy systems employing solar panels that gather the radiant energy from the sun to either heat fluid circulating there through (solar thermal panels), generate electricity (photovoltaic, or "PV" panels) or both. Panels that generate both electricity and useful heat are called photovoltaic thermal panels (PVT), or "hybrid" panels. An example of such solar panels is shown and described in U.S. patent application Ser. No. 12/660,646, filed Mar. 2, 2010 entitled "SOLAR ENERGY SYSTEM, published as U.S. Patent Application Publication No. 2010/0224234 and the specification and disclosure of that patent application is hereby incorporated in its entirety into the present patent application by reference. Another example of such solar panels is shown and described in PCT/US2015/038942 filed Jul. 2, 2015, published as WO 2016/004276 A9. The disclosures of both are herein incorporated by reference in their entireties.

As such, while the solar energy system and the individual modular solar panels of the afore-described patent application are entirely suitable for the purpose of providing heated water and/or electricity, the overall efficiency of such solar systems is critical in their use and thus any enhancement of the heat transfer characteristics of the solar energy system and solar energy panels is beneficial. Additionally, existing hybrid panels (heat and electric) require extensive plumbing both in preparation for an installation (feeder pipes, evacuation pipes) and localized plumbing (plumb each panel to both feeder pipes). It is desirable to incorporate feeder pipes into expanded headers.

The cost of hybrid solar panels and the high cost of installing the same has been the primary reason for stagnancy in the market, so any improvement in design that would enable this critical market segment to grow would be advantageous.

Accordingly, it would be advantageous to provide materials, panel dimensions and various enhanced features of a solar energy system that improve the overall thermal efficiency of the solar panels and thus the system.

SUMMARY OF THE INVENTION

The present invention is a solar energy system comprising at least one and particularly, a plurality of solar panels. The panels comprise photovoltaic cells in conjunction with panels made up of a "bladder" of thin plates of a conductive material, such as a metal (aluminum) or an organic film forming polymeric material, to capture energy (heat) during co-generation of electricity. Within the bladder, the fluid is heated as it passes through a channel formed between thin, planar plates.

The plates may be formed from a heat conductive material, such as a metal or a polymer, and are oriented in parallel planes with a channel formed between the plates. The plates are juxtaposing disposed, typically securably disposed together, and one plate has an outer flat surface with a photovoltaic cell matrix affixed thereto and that controls the flow of liquid passing through the channel to enhance the heat conduction between the liquid and the plates. The ability to control the volume through channels also serves to maximize thermal transference from the PV cell matrix (which gets hot while generating electricity) to the working fluid within the aforementioned "bladder" by forcing the fluid through the panel for even heat absorption throughout the entire area of the panel. The fluid path and volume were modeled to maximally cool the PV layer to generate the highest electrical output, as opposed to other PVT's that seek to generate the maximum heat for the working fluid (to offer a higher temperature fluid for processes). Advantageously, the present invention targets not maximum fluid temperature but rather maximum electricity, which for the present invention is the higher value of the two and achieves this through innovative fluid flow design, thereby cooling the PV panel more evenly than existing PVT's. Even, uniform cooling of the PV layer is one important consideration for maximum electricity generation.

The fluid may be introduced into and recovered from the channel by means of header assemblies. The header assemblies may comprise upper and lower flanges with an end manifold sandwiched therebetween. The end manifold has a plurality of nozzles spaced substantially or fully along the length of opposed edges of the plates and in communication with the channel between the plates. As such, the fluid is introduced and removed from the channel in a smooth, even flow. One of the headers acts as an inlet for the fluid into the channel and the other acts as an outlet for the removal of the fluid after it has passed through the channel. In some instances, an additional pipe may be attached or affixed to the header assemblies, for instance, both top and bottom, to act as a feeder pipe. Normally, an installation of solar panels containing a fluid must be provided with both a feeder pipe to supply fluid and a feeder pipe to remove fluid. By incorporating a feeder pipe into each header assembly, it is possible to avoid plumbing each individual solar panel to pre-installed feeder piping. Moreover, quick connecting means may be provided to connect multiple solar panels. Alternately, using a designed external header, or manifold, of the present invention to distribute fluid evenly reduces installation cost significantly and provides cooled fluid to each panel (not connected in series).

A feeder pipe incorporated into or affixed to each header assembly thereby both feeds and evacuates fluid from the header assemblies described herein. Alternatively, using the external manifold, the same occurs with quick connections from said manifold to each panel.

The size of the nozzles in the inlet header is, in the exemplary embodiment, controllable so that the inlet flow can be increased or decreased by an operator to optimize the overall system when used in an array with multiple panels. In addition, the overall or cumulative openings of the nozzles in the outlet header removing fluid from the channel is larger than the overall or cumulative openings in the inlet header so as to maintain a smooth flow through the channel.

The solar panels of the present invention may be produced easily and inexpensively and, further are easy to assemble.

The ease of manufacture and assembly of the solar panels of the present invention provide great advantages in the use of solar panels for producing heat, heated water and electricity. For example, the solar panels of the present invention may have more than 6% greater annual electricity production versus similar conventional PV cell panels without the thermal technology of the present invention.

In one aspect of the preset invention, a modular solar panel to heat a fluid using sunlight may comprise a first, generally planar plate comprised of a heat conductive material; a second, generally planar plate comprised of a heat conductive material, the second planar plate affixed to the first generally planar plate and oriented in a plane generally parallel to the plane of the first generally planar plate; the first and second generally planar plates being affixed together in a fluid tight relationship forming a channel therebetween, the channel having an inlet for fluid to be introduced into the channel and an outlet for discharging fluid from the channel; each of the first and second, generally planar plates being thin, the second generally planar plate having a plurality of channels defined by alternating partitions therein; and a photovoltaic cell matrix affixed in heat conducting relationship to the second generally planar plate. The inlet may be positioned at an elevation higher then the outlet. The first and second generally planar plates may both comprised of a metal, such as aluminum. The photovoltaic cell matrix may comprise glass or polymer, such as a thin polymer sheet. The inlet includes an orifice in direct fluid communication with an inlet fluid line, and the outlet includes an orifice in direct fluid communication with an outlet fluid line. The partitions may comprise curved corners and ribs having curved ends. The curved ends of the ribs further may comprise sloped portions.

In another aspect of the preset invention, a method of constructing a solar panel may comprise the steps of: providing a first, generally planar plate comprised of a heat conductive material, providing a second, generally planar plate comprised of a heat conductive material and having elongated indentations therein; affixing the second generally planar plate to the first generally planar plate so as be in a plane oriented generally parallel to the plane of the first generally planar plate to form a plurality of channels defined by alternating partitions therein; sealing the perimeter of the first plate to the second plate while leaving a fluid inlet and a fluid outlet to the channel; and laminating a photovoltaic cell matrix to one of the planar plates in heat conducting relationship. The photovoltaic cell matrix may comprise a thin polymer sheet or glass, such as a thin glass sheet. The alternating partitions may be welded to the first plate, or welded to the second plate, or welded to the first and second plates.

In another aspect of the present invention, a structure having a plurality of solar panels affixed thereto and oriented to face the sun, each solar panel may be comprised of: a first, generally planar plate comprised of a heat conductive material; a second, generally planar plate comprised of a heat conductive material, the second planar plate affixed to the first generally planar plate and oriented in a plane generally parallel to the plane of the first generally planar plate; the first and second generally planar plates being affixed together in a fluid tight relationship forming a channel therebetween, the channel having an inlet for fluid to be introduced into the channel and an outlet for discharging fluid from the channel; each of the first and second, generally planar plates being thin, the second generally planar plate having a plurality of channels defined by alternating partitions therein; and a photovoltaic cell matrix affixed in heat conducting relationship to the second generally planar plate; wherein the plurality of solar panels comprises at least a first row of solar panels and a second row of solar panels at an elevation lower that the first row of solar panels, the first row of panels each having inlets and outlets and the second row of solar panels each having inlets and outlets; wherein the inlets of the first and second rows of panels each have fluid inlet lines in fluid communication with a cold fluid supply line; and wherein the outlets of the first and second rows of panels each have fluid outlet lines in communication with a warm fluid return line. The fluid inlet lines may be in fluid communication with the cold fluid supply line via an inlet manifold; and the fluid outlet lines may be in fluid communication with the warm fluid return line via an outlet manifold.

Other features of the present solar energy system will become more apparent in light of the following detailed description of a preferred embodiment thereof and as illustrated in the accompanying drawings.

DETAILED DESCRIPTION OF THE INVENTION

Figure 1:
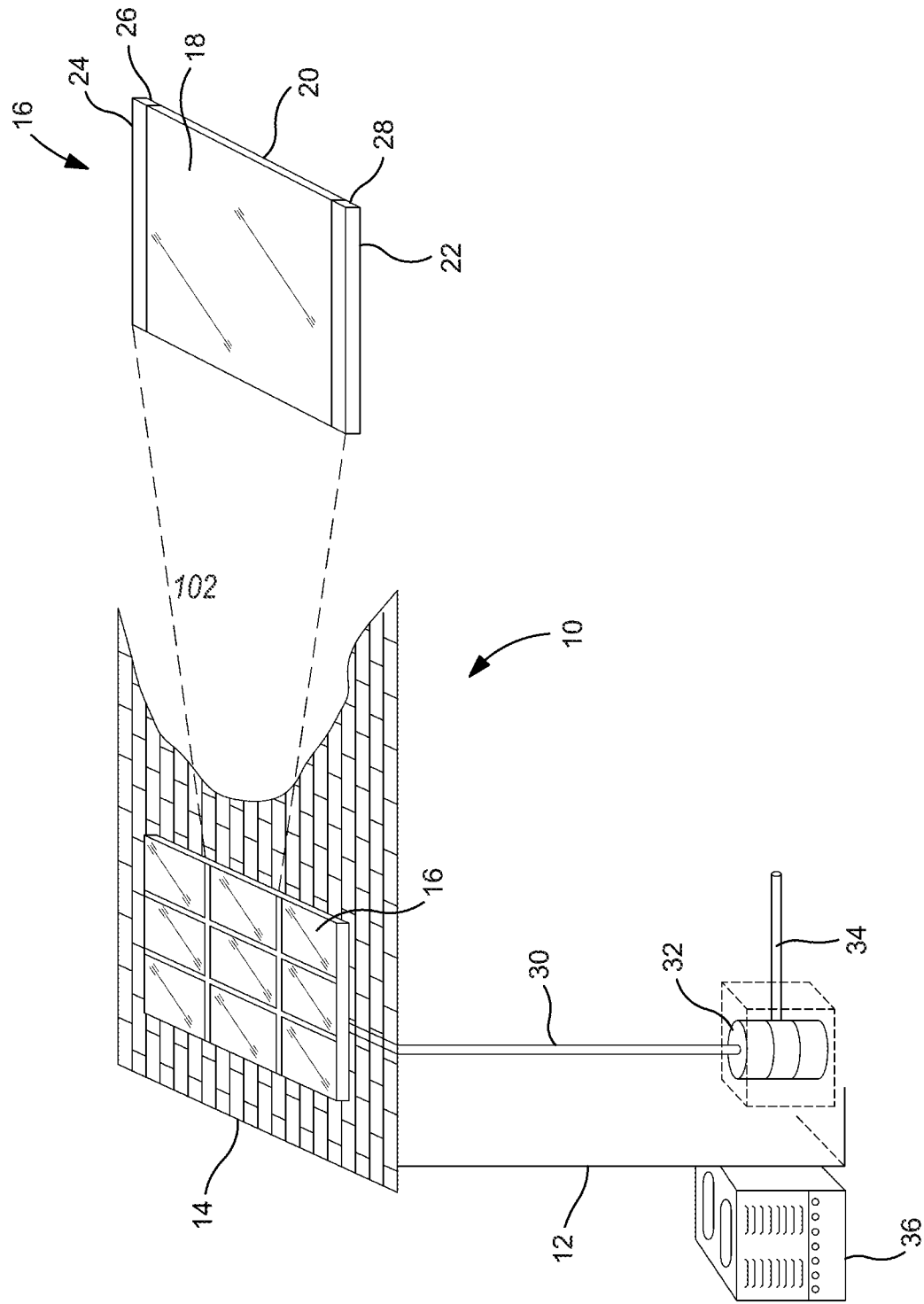
FIG. 1 is a schematic view of a solar energy system constructed in accordance with the present invention.

Turning first to FIG. 1, there is shown a schematic view, partially exploded illustrating a solar energy system 10 constructed in accordance with the present invention. As can be seen, there is a building structure 12 with a roof 14 with an exposure to some form of sunlight, albeit direct or indirect. The building structure 12 can, of course, be any type of building that has a need for electricity and/or heated water. As will be seen, the present invention can be used with a structure that is devoted entirely to the production of heat, heated water and/or electricity i.e. a dedicated structure or frame and not serve any other purpose such as for inhabitants or a structure for housing occupants.

As seen in FIG. 1, the roof 14 has a plurality of solar panels 16 arranged in columns (vertical alignment) and in rows (lateral alignment). As shown, there are nine (9) solar panels 16, however, as will become clear, the number of panels, their size and orientation may vary depending upon the particular installation, including the heat, heated water and/or electricity requirements thereof. With a modular design, a single panel can be used, or two or more, easily connected together to provide sufficient solar energy needs for the structure on which they are placed.

The solar panels 16 may be affixed to the roof 14, or ground-mounted, in a conventional manner allowing for a circulation of air between the solar panels 16 and the roof 14 or may be directly affixed flush to the roof 14. If installed directly to the roof of a structure, there can be insulating material interposed between the solar panels and the roof. One example of a ground-mounted solar energy system 10 is described herein as another aspect of the present invention. As also noted in FIG. 1, there is an exploded solar panel 16 that is comprised of a first plate 18 and a second plate 20.

As can be seen, the first plate 18 is in an upper position with respect to the second plate 20 and the solar panel 16 also includes an inlet header assemblies 24 and an outlet header assembly 22, that will be later explained, however, the inlet and outlet header assemblies 24 and 22 include an inlet 26 and an outlet 28, respectively, for the introduction of a liquid into the solar panel 16 and for the removal of liquid from the solar panel 16 after the liquid has passed through the solar panel 16.

In the embodiment as shown, the inlet 26 in each solar panel 16 is oriented so as to be higher than the outlet 28 with respect to the ground so that the passage of liquid through a solar panel 16 is in a downward direction thereby aided by gravity. That is also true if there are multiple panels, that is, the cold liquid enters the upper panel or panel and then progresses in the downward direction to the lower solar panel or panels. While the liquid may be water that passes through the solar panel 16, other fluids could be used, including, but not limited to, ethylene glycol solution. In the present description, the medium will hereafter be referred to as a liquid for convenience.

As is conventional, the liquid circulates through the solar panels 16 where it is heated by the radiant energy of the sun. In the exemplary embodiment of FIG. 1, the first plate 18 is the upper position and faces the sun while the second plate 20 is in the lower position and faces the roof 14. The heated liquid can pass through a suitable pipe 30 (closed loop system) to a heat-exchanger in reservoir 32. The reservoir 32 may also be of the modular type where additional capacity can be added, or the capacity reduced by the user or the designer by stacking (with suitable connectors) and/or using multiple stacked units depending upon the configuration required. In any event, the heated liquid is stored and accumulated in the reservoir 32 to be used for some end purpose through a discharge pipe 34.

The solar energy system 10 can also include a heating system 36 to provide heat, when needed, so as to maintain the liquid in the reservoir 32 at a predetermined temperature. One type of heating system 36 can be a heat pump; however other systems can be used to maintain that predetermined temperature. The heating system 36 is the only component that will not be intrinsically modular; however, several sizes/capacities (output) are readily available depending on the configuration required.

Figure 2:
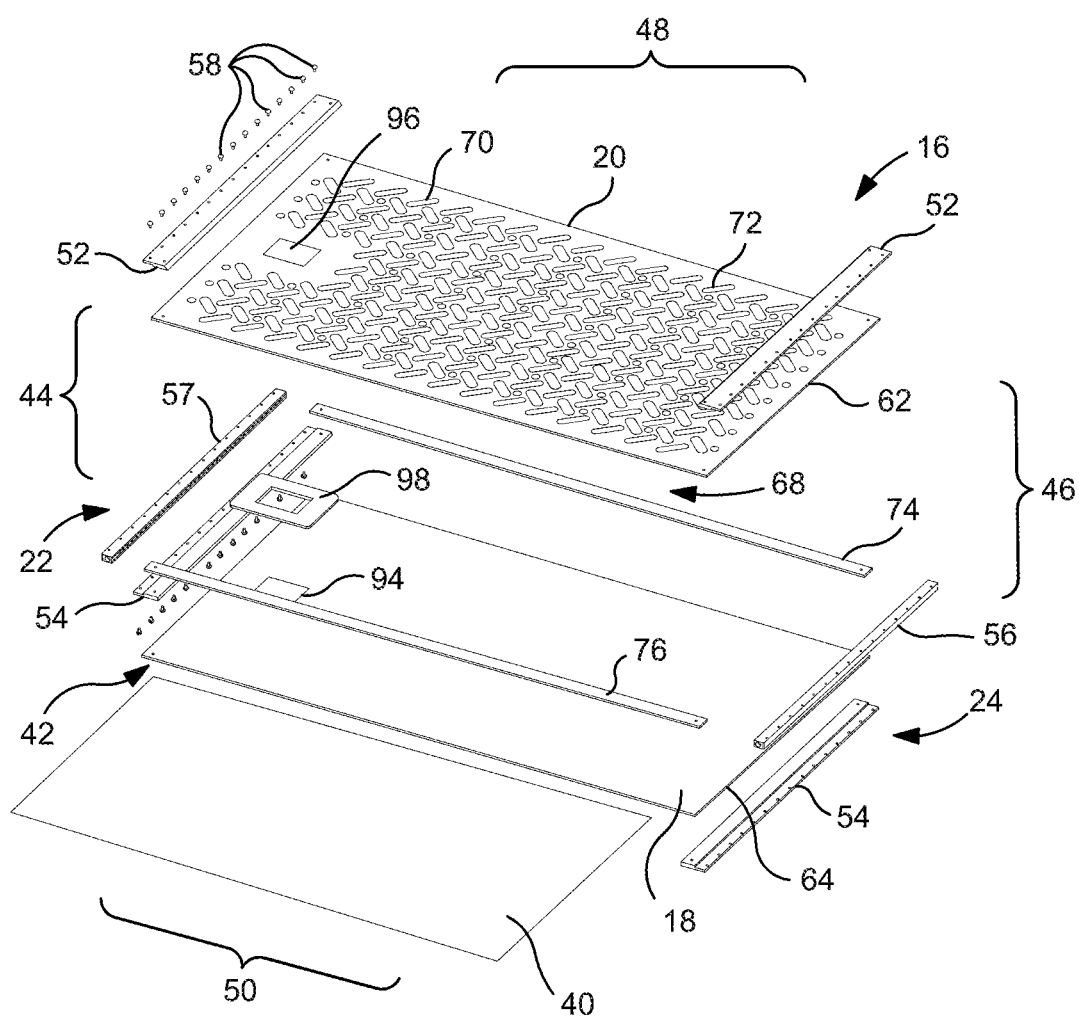
FIG. 2 is an exploded view of a solar panel of the present invention.

Turning now to FIG. 2, taken along with FIG. 1, there is shown an exploded view of a solar panel 16 and illustrating the construction of an individual solar panel 16 of an exemplary embodiment. As can be seen, the solar panel 16 of FIG. 2 is constructed by the use of two, generally planar plates, i.e. the first plate 18 and the second plate 20. As can be seen in FIG. 2, the solar panel 16 is inverted from its normal orientation in use, that is, the first plate 18 is in the lower position with the second plate 20 atop thereof whereas in normal use, the first plate 18 is in the upper position, however, the solar panel 16 is inverted in FIG. 2 in order to better illustrate the particular construction of the second plate 20.

Accordingly, when in use, the uppermost component is the photovoltaic cell 40 (PV cell) or cells and which is conventional and faces the sunlight to receive radiant energy to produce electricity. The PV cell matrix 40 is affixed to the upper surface 42 of the first plate 18 and may be affixed there to by an adhesive or by laminating. PV cells that are usable with the present solar panels are readily commercially available and one of the advantages of the present solar panel is that a PV cell need not be customized but may include almost any of the commercial PV cells currently available.

A typical commercial encapsulated PV cell matrix can be obtained as a unit with a glass or polymer cover to desired dimensions and can be a single PV cell matrix that covers all or substantially all of the area of the upper surface 42 of the first plate 18. As noted, the upper surface 42 of the first plate 18 is a generally planar surface so that the PV cell matrix 40 uniformly covers that surface to enhance the transfer of heat.

In FIG. 2, the solar panel 16 is configured as a rectangle having ends 44, 46 and sides 48, 50, however, it can be seen that other geometrical shapes could be used. As noted, the ends 44, 46 of the solar panel 16 are secured by the inlet and outlet header assemblies 24, 22. In the exemplary embodiment, inlet header assembly 24 is used to introduce a liquid through the solar panel 16 via the inlet 26 (FIG. 1) while outlet header assembly 22 is used to remove liquid from the solar panel 16 via outlet 28 (FIG. 1).

As thus can be seen in FIG. 2, while, as will be later explained, the inlet and outlet header assemblies 24, 22 are basically different in certain respects, each include an upper flange 54 and a lower flange 52. In addition, there is an inlet manifold 56 and an outlet manifold 57. In the making of the inlet and outlet header assemblies 24, 22, the upper and lower flanges 54, 52 are secured together with the inlet and outlet manifolds 56, sandwiched therebetween.

Figure 3:
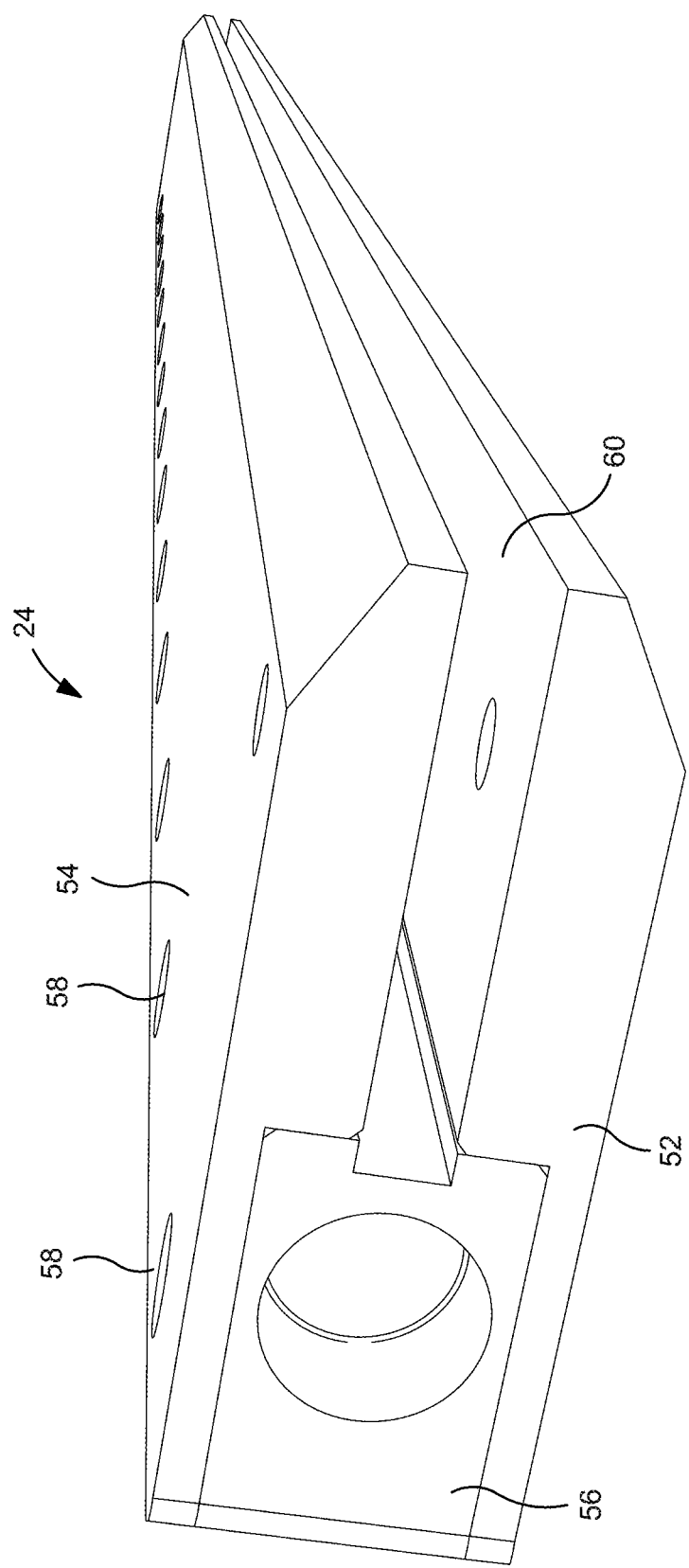
FIG. 3 is a perspective view of the inlet header assembly used with the present solar panel.

In FIG. 3, taken along with FIG. 2, there is a perspective view of a completed inlet header assembly 24 and includes the common components of both the inlet and outlet header assemblies 24, 22, taken along with FIG. 2. Accordingly, describing the inlet header assembly 24, there can be seen the upper flange 54, the lower flange 52 and the inlet manifold 56 positioned therebetween. Assembly of the inlet header assembly 24 can be carried out by fasteners 58 that may be screws, rivets or other fastening devices. As also can be seen, an elongated slot 60 is formed in the inlet header assembly 24 when fully assembled together that receives the end edges 62, 64 of the first and second plates 18, 20 after they have been affixed together as will be later explained.

As explained both the inlet and outlet header assemblies 24, 22 are similar with the exception that a manifold that is sandwiched between the upper flange 54 and the lower flange 52 and that manifold is difference between the inlet and outlet assemblies 24, 22.

Figure 4A:
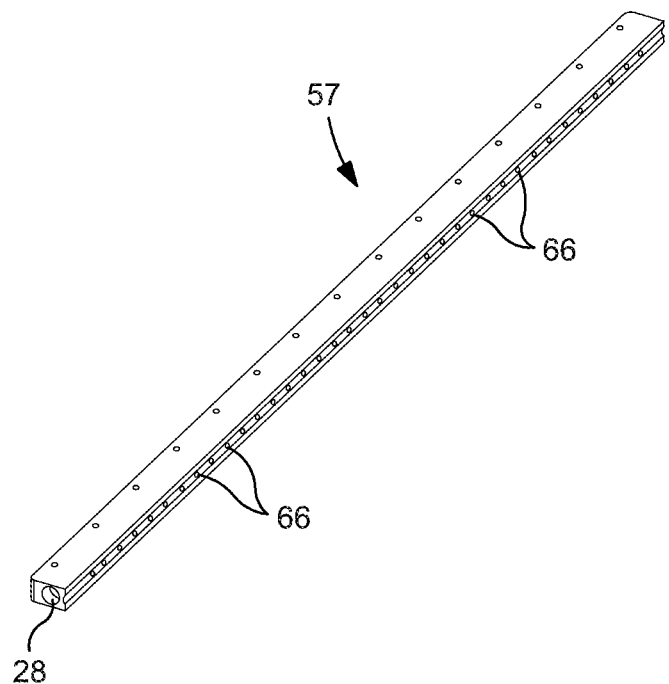
FIG. 4A is a perspective view of the outlet manifold used in construction of an outlet header assembly of the present solar panel and FIG. 4B is an enlarged side view of the outlet manifold.
Figure 4B:
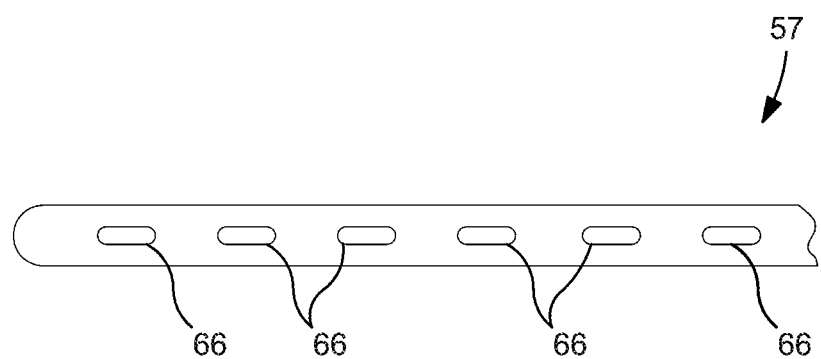

Taking then FIGS. 4A and 4B, there is shown a perspective view and a front view of the outlet manifold 57 and, as can be seen, it includes the outlet 28 that provides a discharge means for liquid exiting an elongated passageway within the outlet manifold 57. A plurality of outlet nozzles 66 are formed in the outlet manifold 57 and each outlet nozzle 66 communicates with the elongated passageway within the outlet manifold 57 such that a liquid exiting through the outlet 28 is received uniformly into of the plurality of outlet nozzles 66.

In FIG. 4B, it can be seen that, in the exemplary embodiment, the outlet nozzles 66 are elongated or oval in shape and can be distributed uniformly along the outlet manifold 57.

Figure 5:
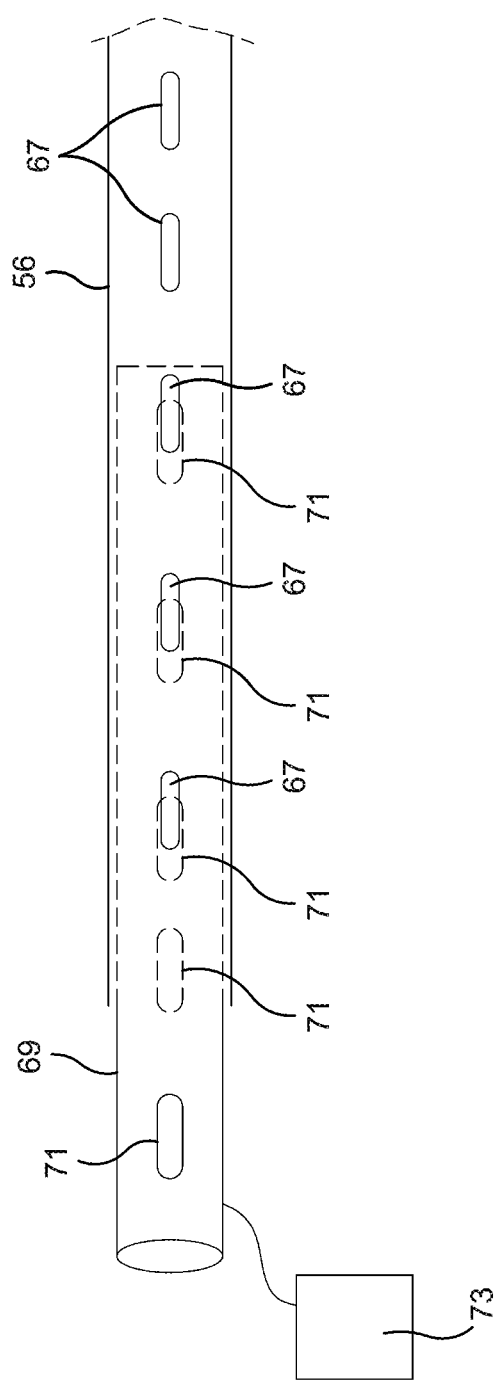
FIG. 5 is a schematic view illustrating the inlet manifold of the present invention.

Turning then to FIG. 5, there is a schematic view of the inlet manifold 56. As can be seen, the inlet manifold 56 has a plurality of elongated inlet nozzles 67 similar to the outlet nozzles 66 of FIGS. 4A and 4B, however there is also a sleeve 69 that slides within the inlet manifold 56 and the sleeve also has a plurality of openings 71 spaced apart the approximately (slightly further apart) the same distance as the inlet nozzles 67 and of a similar size. As such, to alter the flow of liquid through the inlet manifold 56, the sleeve can be moved axially with respect to the inlet manifold 56 so that more or less of the openings 71 are in alignment with the inlet nozzles 67.

Accordingly, when the sleeve 69 is moved to a position where the openings 71 are fully in alignment with the inlet nozzles 67, maximum liquid can pass through the inlet manifold 67. As the sleeve 69 is then moved axially, the openings 71 will be in lesser alignment with the inlet nozzles 67 and the effective cumulative opening of the inlet nozzles 67 is reduced, thus reducing the flow through the inlet manifold.

In that manner, the flow though the inlet manifold 56 can be controlled by an operator and there can be some mechanism 73 to manually or automatically cause the axial movement of the sleeve 69.

Figure 9:
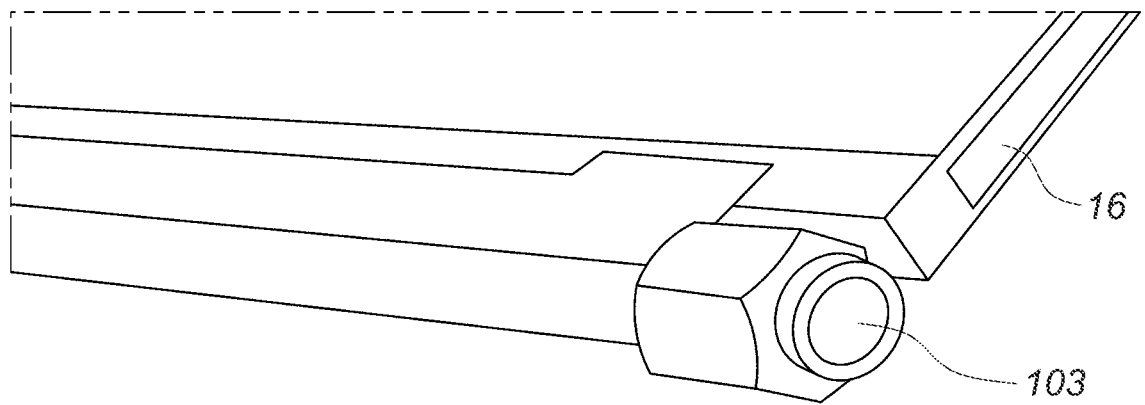
FIG. 9 is a schematic view illustrating a header assembly featuring a second or additional pipe attached or affixed thereto to act as a feeder pipe.

As depicted in FIG. 9, a header assembly of the present invention may include a second or additional pipe 103 attached or affixed thereto to act as a feeder pipe. Such an additional feeder pipe 103 may be used to feed fluid into the header assemblies described herein or evacuate fluid from the header assemblies described herein. The present invention may contain one additional feeder pipe 103 to feed fluid into the header assemblies described herein and another additional feeder pipe 103 to evacuate fluid from the header assemblies described herein.

Returning to FIG. 2, in the assembly of the solar panel 16, the first and second plates 18, 20 are affixed together to form therebetween, a channel 68 for the passage of liquid through the solar panel 16. As described with respect to the inlet and outlet header assemblies 24, 22, once the first and second plates 18, 20 are affixed together as will be explained, the combination fits into the elongated slot 60 (FIG. 3) in the inlet header assembly 24 and an identical elongated slot in the outlet header assembly 22 so that the outlet nozzles 66 of outlet header assembly 57 and the inlet nozzles in the inlet header assembly 24 can communicate with the channel 68. As such, the plurality of inlet nozzles 67 located substantially along or fully along the width of the inlet header assembly 24 introduces liquid into the channel 68 and the outlet nozzles 66 located substantially along or fully along the width of the outlet header assembly 22 removes liquid from the channel 68 so as to create a smooth even flow of the liquid through the channel 68.

Contributing to the smooth flow is the feature that the overall opening cumulative area of the outlet nozzles 66 is designed to be larger that the cumulative area of the inlet nozzles 67 so as to prevent a back up of pressure through the channel 68.

The flow of the liquid is further enhanced by the use of indentations 70 in the second plate 20 that protrude into the channel 68. The indentations 70 are uniformly distributed over the second plate 20 and extend into the channel 68 but do not extend all the way through the channel 68 so as to contact the first plate 18. In that manner, the indentations 70 allow the liquid passing through the channel 68 to occupy the entire area of the lower plate 20 for maximum heat transfer as well as coax the liquid to flow through the narrow space, instead of taking the fastest route (possible caused by slope, or easiest flow path) and the indentations 70 also serve to manage the quantity of liquid passing through the solar panel 16.

Figure 10:
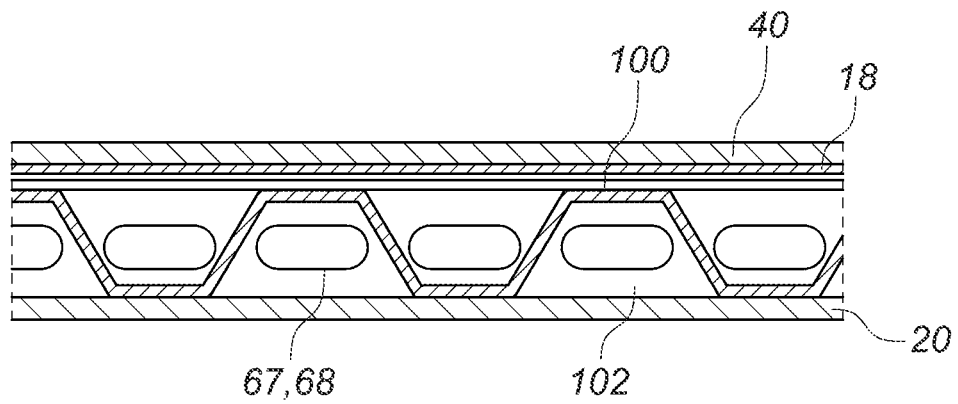
FIG. 10 is a schematic view illustrating a solar panel featuring a divider of metal in a corrugated form or shape, such as, for instance, aluminum or a suitable polymer provided between the two plates providing effective channels for fluid flow.

Alternatively, as depicted in FIG. 10, instead of indentations 70, a divider of metal 100 in a corrugated form or shape, such as, for instance, aluminum or a suitable polymer, may be provided between the two plates described herein, such as first and second plates 18, 20, thereby providing effective channels 102 for fluid flow. Such a solar panel featuring such a divider of metal 100 allows securing the two plates described herein together. The divider 100 may be secured to the plates by welding, adhesive affixing, and the like.

Figure 6A:
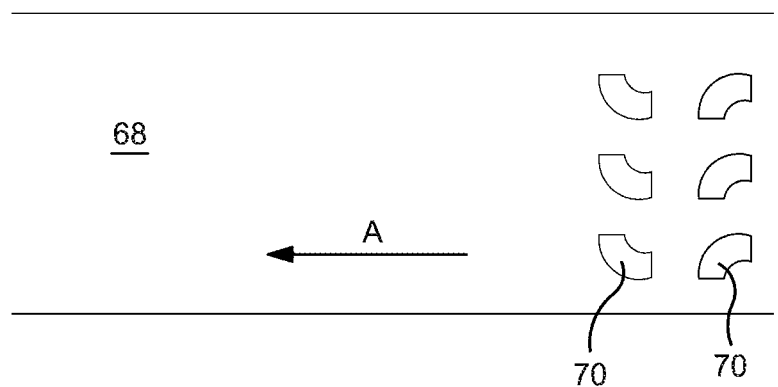
FIG. 6A is a schematic view illustrating the shape and orientation of indentations used in the main fluid channel of the present and FIG. 6B is a side view of those indentations.
Figure 6B:
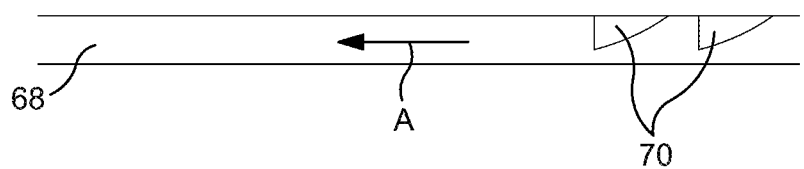

Turning to FIGS. 6A and 6B, taken along with FIG. 2, there is a top view and side view showing the channel 68 and an exemplary embodiment illustrating the shape and orientation of the indentations 70. As can be seen, the indentations 70 are arranged in rows (parallel to the direction of flow of the liquid illustrated by the arrow A) of FIG. 6A and columns (normal to the flow of liquid).

The indentations 70 can further be described as spiral shaped with the ends of the spiral oriented so as to be normal to the direction of flow through the channel 68. In addition, as seen in FIG. 6B, one end of the spiral indentations 70 increasingly projects into the channel 68.

Figure 7:
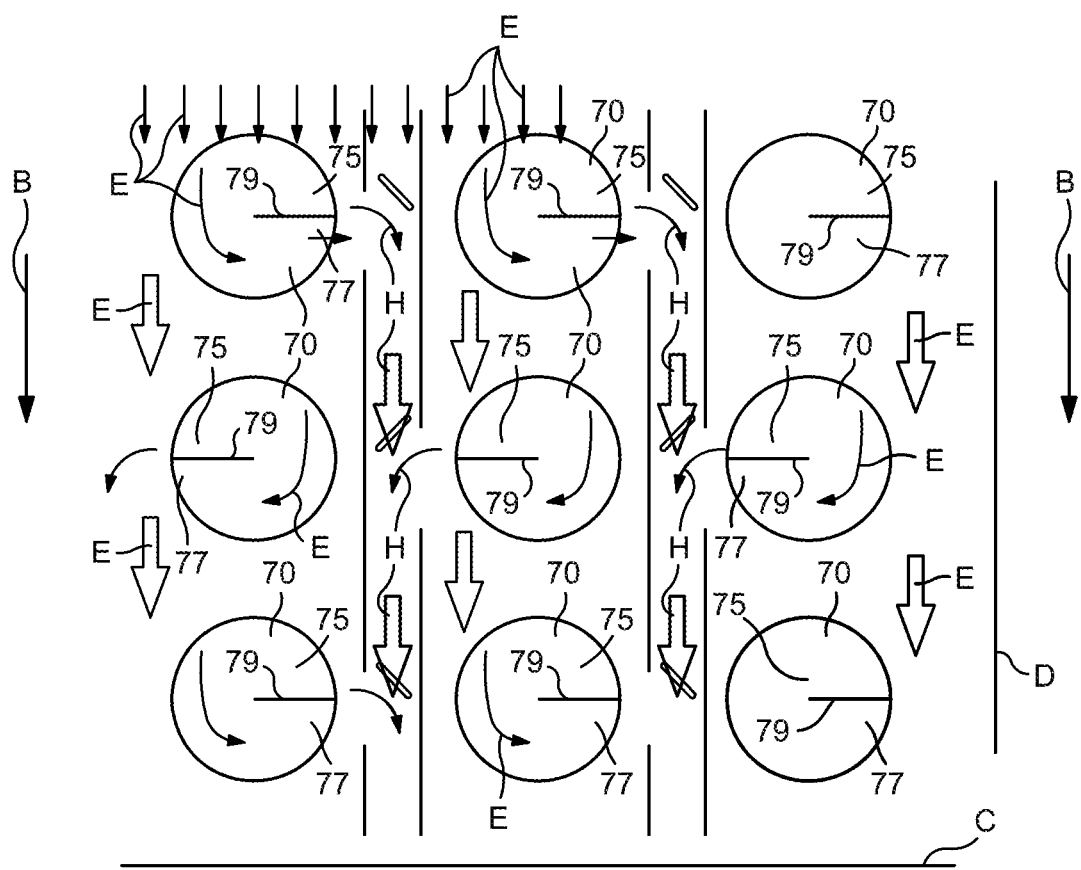
FIG. 7 is a further schematic view illustrating the shape and orientation of the indentations.

Turning to FIG. 7, there is a schematic view illustrating the shape and orientation of the indentations 70. In FIG. 7, the direction of the flow of fluid is indicated by the arrows B. As can be seen, the indentations 70 are arranged in rows normal to the direction of flow, as indicated by the line C and columns indicated by the line D that are parallel to the flow of fluid. In the embodiment of FIG. 7, cool fluid may enter at a top, typically elevated, portion of the channel 68, heated fluid may exit at a bottom, typically lower, portion of the channel 68.

The indentations 70 are basically one circle or 360 degrees of a spiral coil where one end 75 of the coiled indentation 70 is basically even with the planar surface of the second plate 20 and the other or leading end 77 is displaced outwardly, away from the planar surface of the second plate 20. As with a spiral configuration, there is a split 79 where the one end 75 and the leading end 77 of the indentations 70 are separated by a finite distance.

Accordingly, as the flow of cooler fluid, shown by the arrows E enters the channel 68 and a portion of the flow is diverted by the indentations 70 or follows channels 102 and is heated so as shown by the arrows H while forming a swirling pattern of flow and thus enhancing the heat conduction. In the exemplary embodiment the split 81 is normal to the flow of fluid and can be oriented such that the split 81 is 180 degrees offset with alternating rows. The spiral pattern of the flow of fluid forces the cascading fluid to swirl around the hot spots of the PV cell matrix 40 (FIG. 2) so as to maximize the heat transfer to the fluid. Alternatively, providing channels 102 facilitates fluid flow through the panels.

The indentations are 70 are pressed onto the second plate such that there is a smooth continual metal transition between the second plate 20 and the indentations 70 and no break or space therebetween.

In addition to the indentations 70, there are dimples 72 formed in the second plate 20 that, again, extend inwardly and are uniformly distributed on the second plate 20. The dimples 72 extend inwardly through the channel 68 to contact the first plate 18 and a laser weld is made at the point of contact so as to secure the first and second plates 18, 20 together. The use of the dimples 72 has two functions, that is, the dimples 72 keep the first and second plates 18, 20 equally spaced apart throughout the solar panel 16 such that the channel 68 has a uniform depth and also the use of the laser welded dimples 72 keeps the first and second plates 18, 20 from bulging in the case of an unexpected expansion. That expansion can, however, also be controlled by a safety valve and/or industry standard "drop back" system.

As further components of the solar panel 16, there are side members 74, 76, again which may be comprised of a metal such as aluminum, and which are positioned along the sides 48, 50 of the solar panel 16 between the first and second plates 18, 20 to seal the sides 48, 50 and prevent the leakage of liquid from the channel 68. The sides 48, 50 can be laser welded to the side members 74, 76 at retain the side members 74, 76 in the desired positions.

Figure 8:
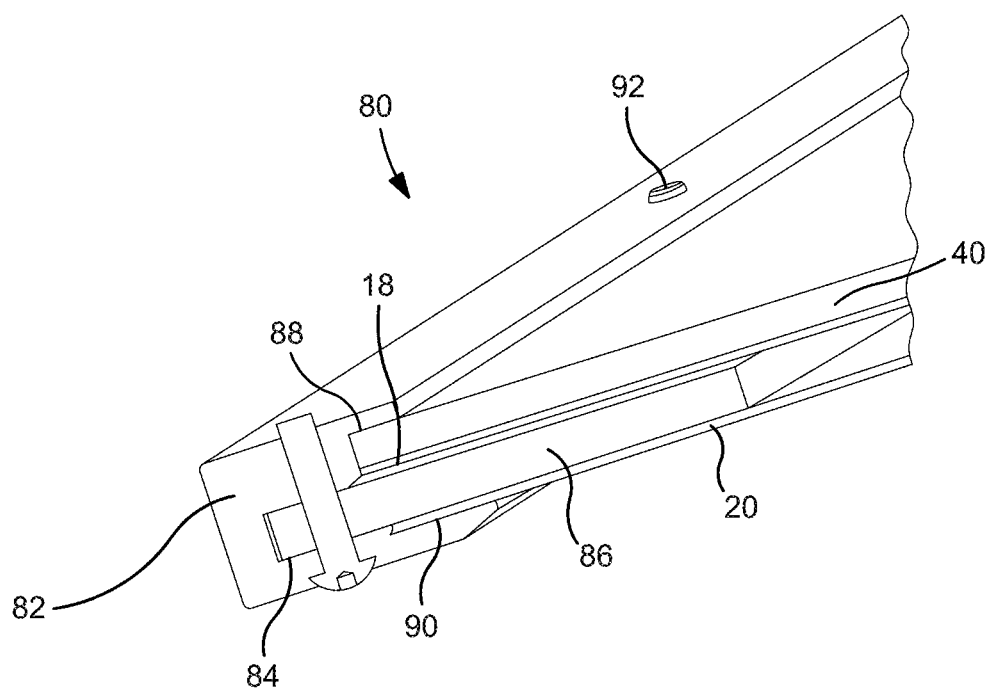
FIG. 8 is a perspective view illustrating a side support assembly used with the solar panel of the present invention.

In FIG. 8, taken along with FIG. 2, both side members 74, 76 may be constructed as a side support assembly 80 that can be used to strengthen the solar panel 16. Since the side support assemblies are the same along each side 48, 50 of the solar panel 16, only one will be described. As such the side assembly 80 includes an outer edge extrusion 82. The edge extrusion 82 has a main channel 84 for retaining a side seal 86 that, as with the side members 74, 76, is interposed between the first and second plates 18, 20 to provide a seal therebetween.

As also can be seen, the PV cell matrix 40 is affixed within a recess 88 in the edge extrusion 82 along with the first plate 18. In a similar manner, the second plate 20 also fits within a recess 90 in the edge extrusion. Fastening devices 92, such as screws or rivets pass through the edge extrusion 82 to retain all of the components together.

Returning to FIG. 2, as a further feature of the solar panel 16, there is an opening 94 formed in the first plate 18 and an opening 96 formed in the second plate 20 that are in alignment when the first plate 18 has been affixed to the second plate 20 as previously described. A gasket 98 is provided intermediate the openings 94, 96 to seal between the first and second plates 18, 20. As such, the openings 94, 96 provide a through opening in the solar panel 16 for the passage of electrical wiring or other utility needs.

All these components will be able to be computer-configured (for estimation and installation instructional purposes) based on user input (size of area to be heated, hot water usage, number of people, structure size, insulation level, geographic region, etc.) and all pertinent data also available based on this input such as configuration, size, efficiencies, estimated savings (based on user input), etc.

Further, these solar panels provide sufficient hot water which is maintained at a constant temperature in a reservoir of sufficient capacity. Instead of firing up alternative fuel-driven heating units when the temperature drops several degrees, the unit is designed to maintain a constant predetermined temperature, eliminating the inefficient 'peaks and valleys' in favor of a more efficient temperature maintenance. Additional (modular) solar panels can be added to provide for sufficient heat/hot water or co-generation of electricity, within the modular design.

Thus, the smallest common denominator, the size appropriate for a small garage, for example, will be the basic size of each modular solar panel unit, and larger sizes can be assembled by easily adding more of these modular units together.

The construction details of the invention as shown in FIGS. 1-5 are that the system configuration can be adapted to any size construction. The materials used will be appropriate for exposure (rooftop) and ideally suited for all climates and conditions. In addition, the units can be easily configured and installed into new construction as easily as retro-fitting into existing structures. In essence, the solar panel includes a bladder comprised of two aluminum sheets bonded together allowing the working fluid to flow in a thin "sheet" evenly across the entire back of the panel, now only separated by a thin aluminum wall, thereby cooling the entire array of PV cells more efficiently and extracting more heat for hot-water in the process.

The two sheets of aluminum can be laser-welded, or corner formed, for a water-tight seal and laser-welded internally to maintain proper spacing (fluid volume control) and to prevent expansion (in addition to a safety pressure valve). The invention is used to further manage the total volume of fluid within the panel during operation as well as to coax the fluid into an even flow across the full plane of the panel. The design forces the fluid over the hottest areas of the PV layer, enabling more efficiency in cooling and more heat extracted for generating hot water. Moreover, the fluid flow may be designed to more evenly cool the PV, allowing for maximum electricity generation, as opposed to uneven cooling which degrades electricity production.

In one broad embodiment, the present invention is a unique multi-dimensional solar panel system incorporating solar panels to heat water and PV cells to generate electricity using innovative materials, dimensions and construction. Additionally, the present invention is totally modular in concept for extremely easy installation and maintenance.

Figure 11:
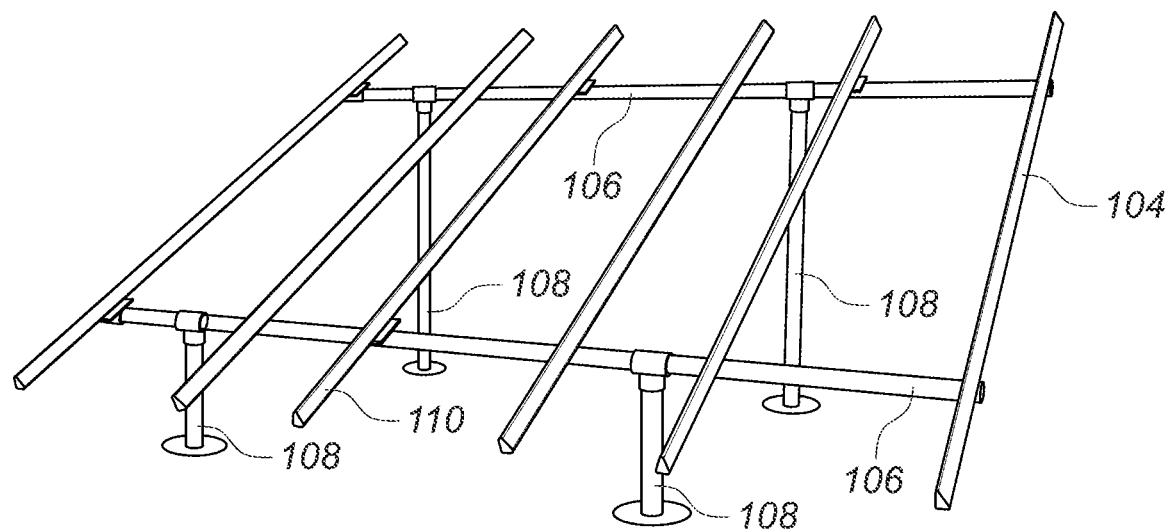
FIG. 11 is a perspective view of a representative rack for supporting an array of solar panels.

In a particular embodiment of the invention, the solar panels may be mounted on a rack, where a plurality of such panels are interconnected so as to be in fluid engagement and are disposed above a surface such as the roof of a structure or the ground. A representative rack is shown in FIG. 11 and contains support provisions for the inclined mounting of such panels in the manner indicated. In particular, rack 104 comprises a pair of horizontal support members 106, each in turn supported by a plurality of vertical footings 108. A plurality of panel support members 110 are mounted on the horizontal support members 106 and in a perpendicular disposition thereto.

In accordance with a feature of the present invention, horizontal support members 106 are also adapted to serve as fluid conduits for ingress and egress of heat exchange fluid through the respective solar panels. To facilitate the use of the horizontal support members 106 as fluid conduits, the support members are prepared from stainless steel, or a like non-corrosive and inert material, or lined with a non-corrosive and inert material.

Figure 12:
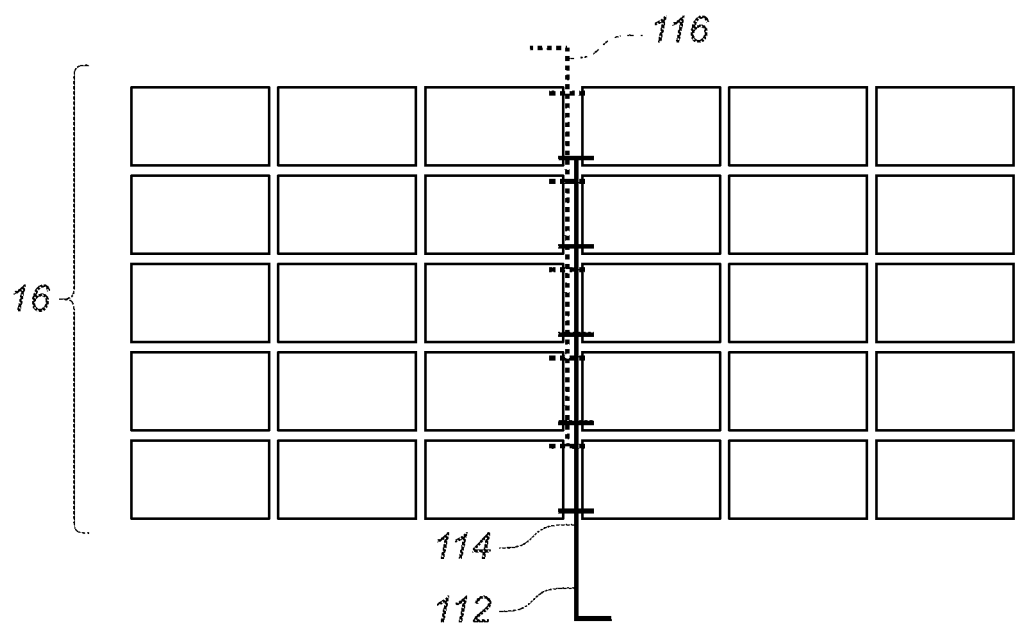
FIG. 12 is a schematic view of the fluid flow path with a manifold system in accordance with an embodiment of the invention.

Referring now to FIG. 12, a schematic representation of a panel assembly is shown, and the path and configuration of the fluid conduits can be seen. Accordingly, there is a first manifold of fluid conduits 112 that are in fluid communication with a vertically lower support member and that delivers the heat exchange fluid to the respective solar panels 16 or receives the heat exchange fluid from the respective solar panels 16 from a plurality of connecting pipes, not shown, that extend between the support member and the respective lower headers of each of the panels.

For the embodiments where fluid flow is from top to bottom (or downward flow), such as the panels associated with the flow patterns as described in conjunction with FIG. 7, fluid may be delivered to the upper headers labeled in this figure as 116. Fluid may then travel vertically downward through each of the respective panels and may then removed from the panels 16 through lower headers 114 where it is gathered and forwarded to corresponding connector pipes, not shown here, that, after heat recovery, deliver the fluid to fluid conduits 116 for recirculation through the system.

The present invention, however, is not so limited. Panels of the present invention may also have fluid flow pattern from bottom to top (or upward flow). In such a case, fluid may be delivered to the lower headers labeled in this figure as 114. Fluid may then travel vertically upward through each of the respective panels and may then removed from the panels 16 through upper headers 116 where it is gathered and forwarded to corresponding connector pipes, also not shown here, that, after heat recovery, deliver the fluid back to fluid conduits 114 for recirculation through the system. Non-limiting examples of panels of the present invention having an upward fluid flow pattern are described below, for example in conjunction with FIGS. 13-16B. Nevertheless, it is within the scope the present invention to have panels with upwardly, downwardly or laterally designed flow channels, and if desired, to modify fluid flow from upward flow to downward flow and/or modify fluid flow from downward flow to upward flow.

Figure 13:
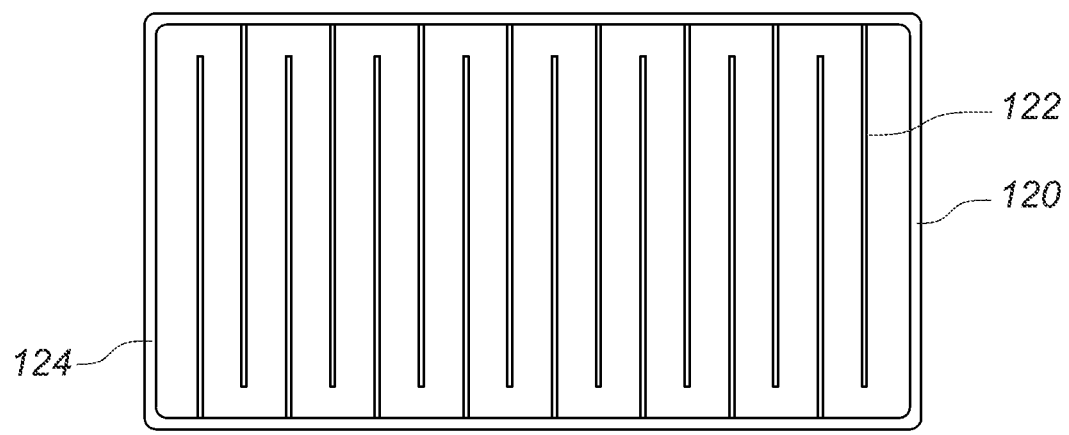
FIG. 13 is a plan view of the interior framework and flow path of a solar panel in accordance with the invention.

In a further alternative embodiment of the present invention, the solar panels 16 may be prepared with a different fluid flow path and construction. Accordingly, and with reference to FIG. 13, panel 120 is shown which defines a simplified alternative flow path established by alternating partitions 122 as shown. The outer perimeter of panel 120 is defined by a frame member 124 that is capable of being formed from a single, continuous length of tubular or like-shaped, material. In a particular embodiment, the material may be aluminum and as shown in FIG. 13, may be or define a curvature at each of the four corners of the essentially rectangular perimeter.

Figure 14:
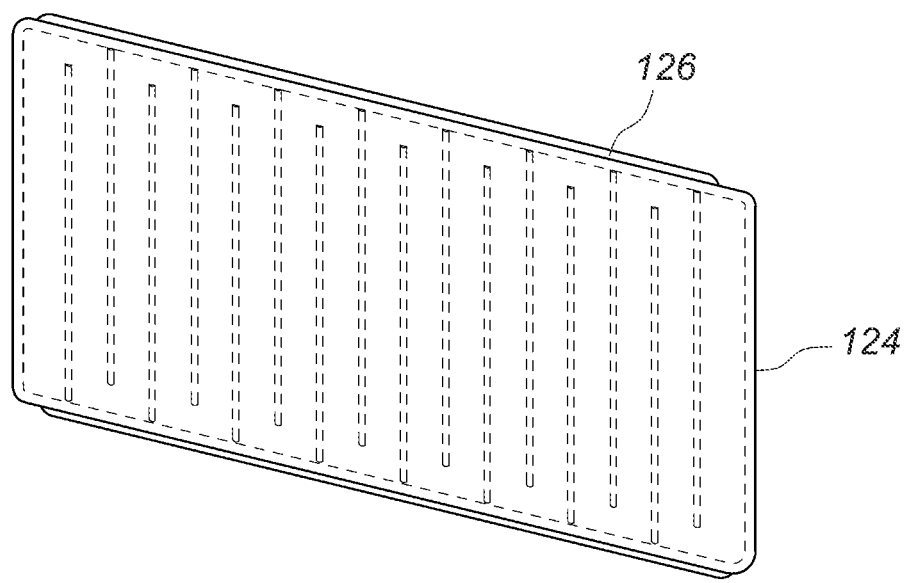
FIG. 14 is a perspective view of the solar panel of FIG. 13 depicting the outer surface of the panel, where the interior structures are defined by embossments.

In an alternate embodiment of this construction, illustrated in FIG. 14, the outer frame and partitions of panel 120 may be defined by an embossment or imprint of one of the two sheets 124, 126 making up the panel 16. In such event, the construction of the panel is achieved simply by the embossment of one of the two sheets and the subsequent bonding, gluing or other fastening of the respective sheets to each other with the embossed members contacting the adjacent sheet, to define the final panel.

Figure 15:
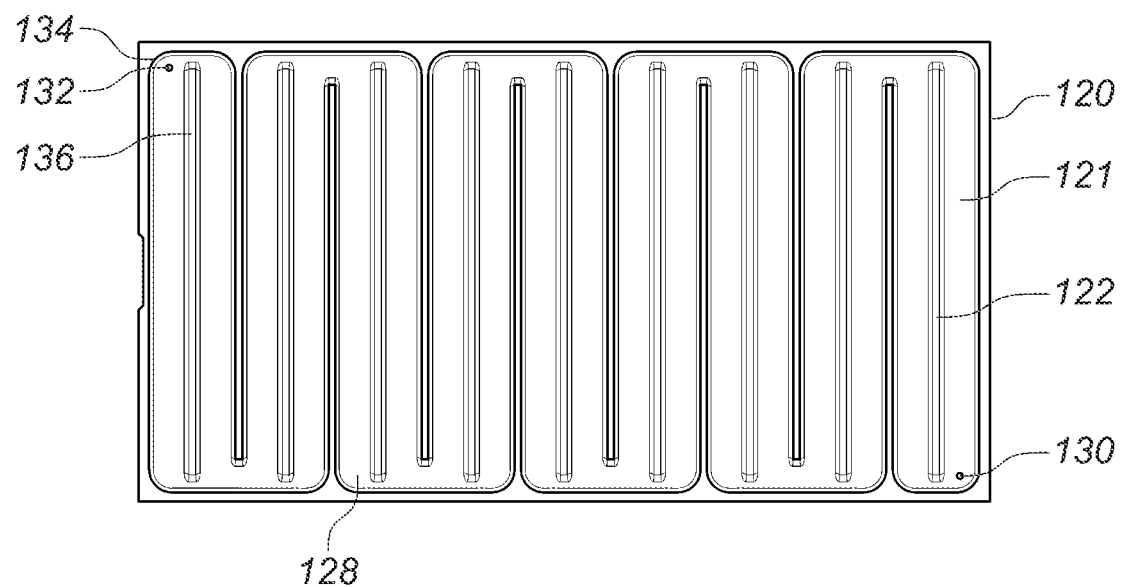
FIG. 15 depicts an alternative embodiment of the solar panel of FIG. 13.
Figure 16A:
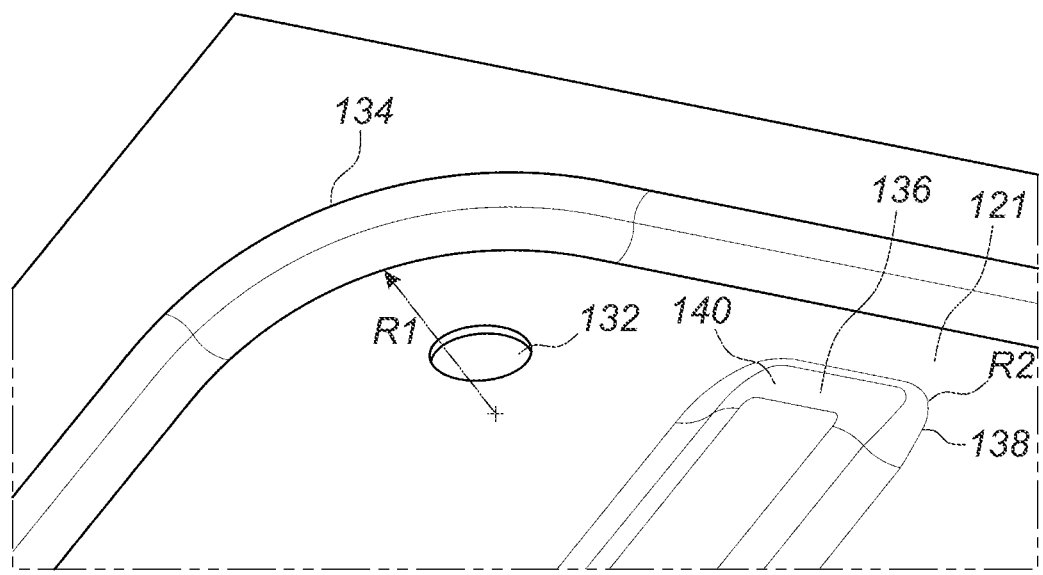
FIG. 16A is an exploded view of a portion of the soar panel of FIG. 15.
Figure 16B:
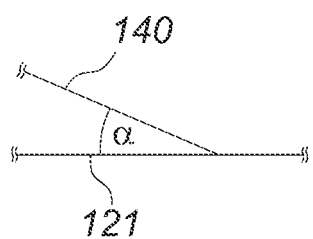
FIG. 16B depicts a sloped arrangement of a portion of the solar panel of FIG. 16A.

As depicted in FIGS. 15 and 16A, panel 120 may have corners 134 that have corner radii to impart, inter alia, more consistent fluid flow through the serpentine path 128 of panel 120. Corners 134 may have a radius of curvature R1 from about 20 mm to about 60 mm, more desirably from about 30 mm to about 42 mm. Further, the rib ends 136 of the alternating partitions 122 may also have curved edges 138. The curved edges 138 may have a radius of curvature R2 from about 3 mm to about 12 mm, more desirably from about 4 mm to about 8 mm. The rib ends 136 may include sloped ends 140. As depicted in FIG. 16B, the sloped ends 140 may be at an acute angle α from the base surface 121 of the panel 120. The acute angle α may vary from about 15 degrees to about 30 degrees, more desirably from about 20 degrees to about 25 degrees. The panel 120 may further include orifices or other openings 130, 132 for ingress and egress of fluid, such as heat exchange fluid.

Figure 17:
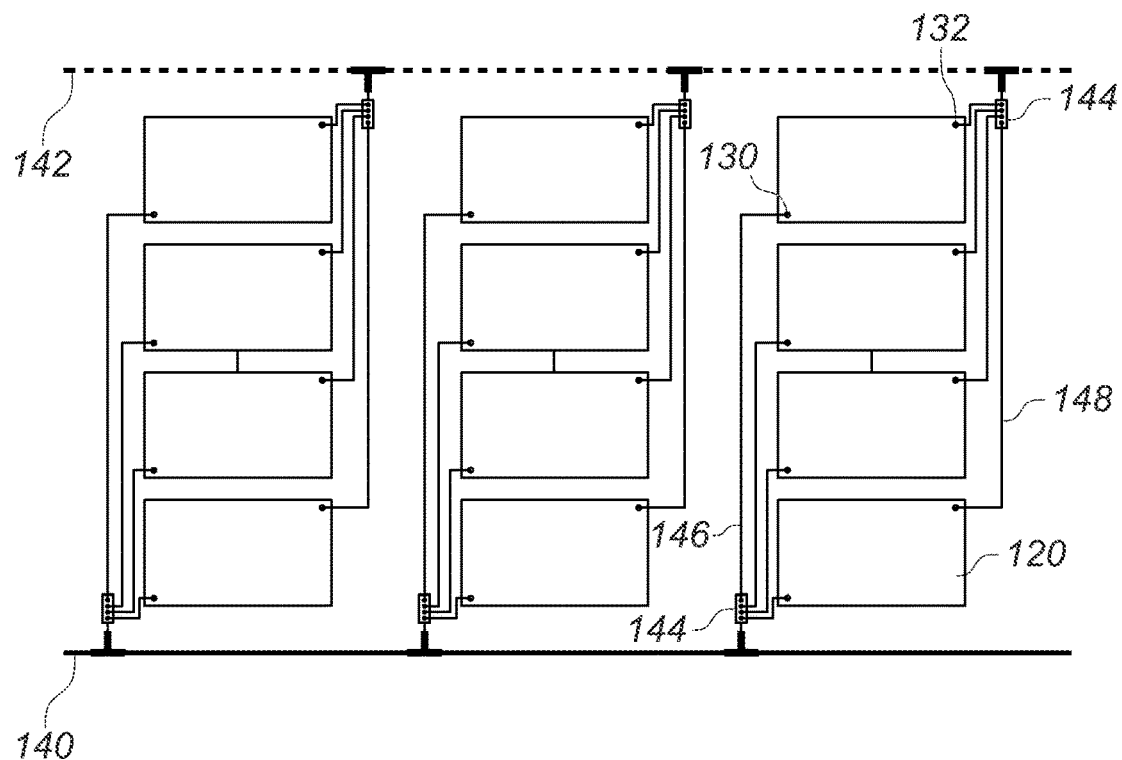
FIG. 17 depicts a top schematic view solar panel loop layout according to the present invention.

The solar panels 120 of the present invention need not have the "integrated header" or rack design as depicted in FIG. 11. As depicted in FIG. 17, individual fluid inlet lines 146 may be in fluid communication with individual panels 120. The inlet and outlet headers 22, 24 may no longer be required, and as described below the inlet and outlet headers are replace with simple tubing or hose arrangements and connections. The fluid inlet lines 146 may be in fluid communication a cold fluid supply line 140 via a manifold 144. While one fluid inlet line 146 is depicted as being in fluid communication with one inlet orifice 130 of one panel 120, the present invention is not so limited. For example, one or more fluid inlet lines 146 fluid may branch or otherwise partition or divide to be in fluid communication with one or more inlet orifices 130 or one or more panels 120. In a similar fashion, individual fluid outlet lines 148 may be in fluid communication with individual panels 120. The fluid outlet lines 148 may be in fluid communication with a warm fluid return line 142 via a manifold 144. While one fluid outlet line 148 is depicted as being in fluid communication with one outlet orifice 132 of one panel 120, the present invention is not so limited. For example, one or more fluid outlet lines 148 may branch or otherwise partition or divide to be in fluid communication with one or more outlet orifices 132 or one or more panels 120. The lines 140, 142, 146, 148 may be plastic or metal. High density polyethylene (HDPE) is one useful plastic material, especially for lines 140, 142. Lines 146, 148 may be flexible lines or hoses. One useful material for such flexible lines or hoses is ethylene propylene diene monomer (EPDM), a synthetic rubber material used in a range of applications. The lines may be insulated or uninsulated. Typically, the warm fluid return line 142 may be insulated. The lines 140, 142, 146, 148 may be the same material or different material. The lines 140, 142, 146, 148 may vary in size, including line diameter, as necessary. Non-limiting advantages of the arrangement depicted in FIG. 17 may include ease of installation, flexibility for varying configurations, and/or reduced system pressure drop.

Figure 18:
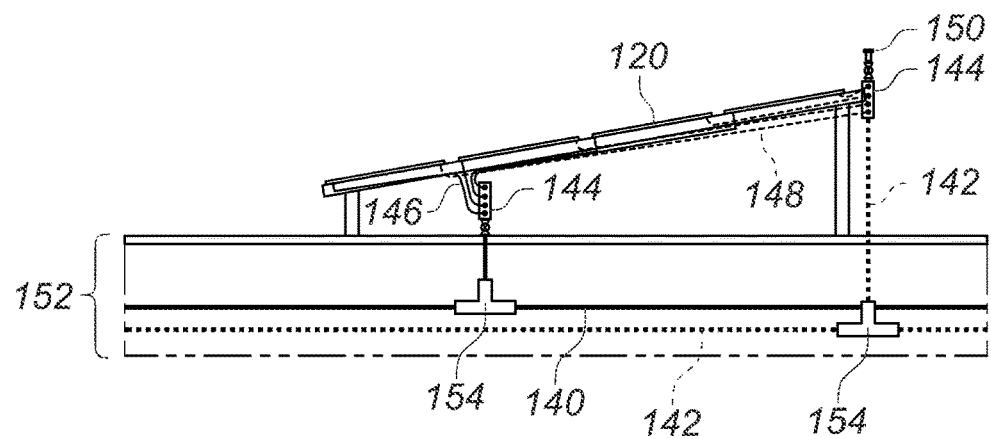
FIG. 18 depicts a side schematic view of the solar panel loop of FIG. 17.

FIG. 18 depicts an arrangement of the solar panel 120 configuration of FIG. 17. Such an arrangement is not limiting, and other arrangements may suitably be used. The cold fluid supply line 140 and the warm fluid return line 142 may be partially or substantially disposed below grade or underground 152. Different portions of the cold fluid supply line 140 and different portions of the warm fluid return line 142 may be joined via different connectors 154, such as T-junctions as depicted in FIG. 18. An air vent 150 may be disposed at a portion of warm fluid return line 142. The air vent 150 may be automatic or manual in operation. The air vent 150 is typically disposed at the highest elevation point in the system, which is depicted in FIG. 18 as being about the manifold 144 for the warm fluid return line 142. The arrangement of FIG. 18 is not limited to being below grade or underground, and other configurations, such as roof top configurations, may suitably be used.

Figure 19A:
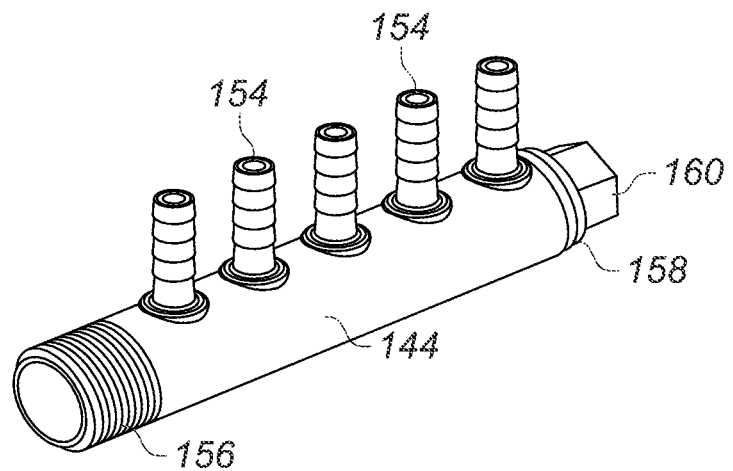
FIGS. 19A and 19B depict manifolds of the solar panel loops of FIGS. 17 and 17.
Figure 19B:
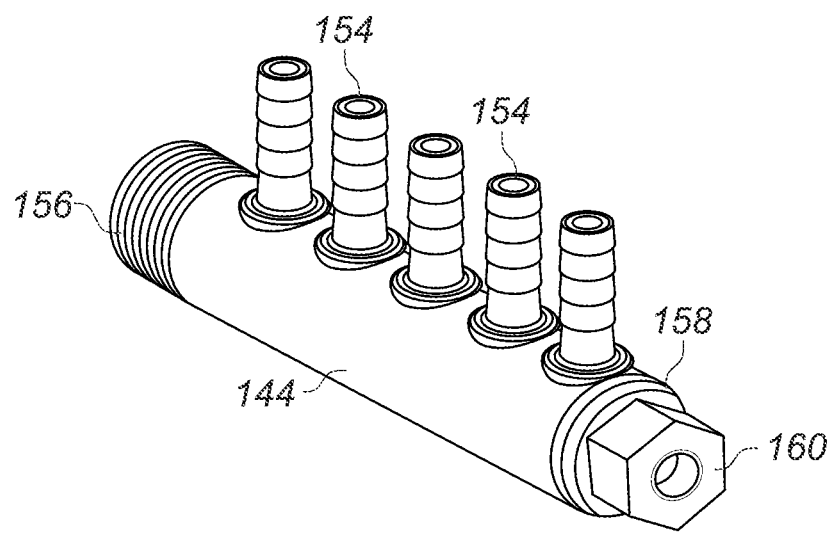

FIGS. 19A and 19B depict one configuration of the manifold 144. The manifold may have a plurality of number of outlet ports 154. The outlet ports 154 are used to connect to individual fluid inlet or outlet lines 146, 148. The outlet ports 154 may be in the form of barbed fittings, especially when the fluid inlet or outlet lines 146, 148 are made of flexible material, such as EPDM hose. One end of the manifold 144 may be a threaded end for securement to the cold fluid supply line 140 and the warm fluid return line 142. The present invention is not limited to threaded ends 144, and other configurations may suitable be used. The opposed end 158 of the manifold 144 may have a connection 160, which may be open to be in fluid communication with other devices, such as the air vent 150 or tubing or piping for the same. The connection may be a closed end if no other connection is necessary. The manifold 144 may have a ball valve (not shown) to prevent undesired flow.

In one aspect of the present invention, the PV cell matrix 40 may comprise a thin polymer sheet instead of glass. The first and second plates 18, 20 or panels 120 are aluminum substrates such that the assembly is designed to fit into a standard PV laminator to provide a PVT panel. The PVT panel of the present invention produces a panel that provides more total thermal and electrical energy, such as four times, that of standard PV.

While the foregoing written description of the invention enables one to make and use what is considered presently to be the best, most convenient, most configurable and in all ways the most advantageous solar system thereof, those of any skill level will understand and appreciate the existence of variations, combinations, and equivalents of the specific embodiment, method, and examples herein. The invention should therefore not be limited by the above described embodiment, method, and examples, but by all embodiments and methods within the scope and spirit of the invention as claimed.

The invention claimed is:

1. A modular solar panel to heat a fluid using sunlight comprising:
   a first, generally planar plate comprised of a heat conductive metallic material;
   a second, generally planar plate comprised of a heat conductive metallic material, the second planar plate affixed to the first generally planar plate and oriented in a plane generally parallel to the plane of the first generally planar plate;
   the first and second generally planar plates being affixed together in a fluid tight relationship to form the panel and forming a channel therebetween, the channel having an inlet for fluid to be introduced into the channel and an outlet for discharging fluid from the channel;
   the second generally planar plate having a plurality of channels defined by alternating partitions therein to define a serpentine path of the panel; and
   a photovoltaic cell matrix affixed in heat conducting relationship to the second generally planar plate;
   wherein the serpentine path comprises curved corners having a radius of curvature from about 20 mm to about 60 mm and the partitions comprise elongate ribs having curved rib ends having a radius of curvature from about 3 mm to about 12 mm.

2. The modular solar panel of claim 1, wherein the outlet is positioned at an elevation higher then the inlet.

3. The modular solar panel of claim 1, wherein the first and second generally planar plates are both comprised of aluminum.

4. The modular solar panel of claim 1, wherein the photovoltaic cell matrix comprises glass.

5. The modular solar panel of claim 1, wherein the photovoltaic cell matrix comprises polymer.

6. The modular solar panel of claim 1, wherein the photovoltaic cell matrix comprises a thin polymer sheet.

7. The modular solar panel of claim 1, wherein the inlet includes an orifice in direct fluid communication with an inlet fluid line.

8. The modular solar panel of claim 1, wherein the outlet includes an orifice in direct fluid communication with an outlet fluid line.

9. The modular solar panel of claim 1, wherein the curved ends of the ribs further comprise sloped portions being sloped at an acute angle from about 15 degrees to about 30 degrees from a base surface of the panel.

10. A method of constructing a solar panel comprising the steps of:
    providing the first, generally planar plate and the second, generally planar plate of claim 1;
    affixing the second generally planar plate to the first generally planar plate so as be in a plane oriented generally parallel to the plane of the first generally planar plate to form a plurality of channels defined by alternating partitions therein;
    sealing the perimeter of the first plate to the second plate while leaving a fluid inlet and a fluid outlet to the channel; and
    laminating a photovoltaic cell matrix to one of the planar plates in heat conducting relationship.

11. The method of claim 10, wherein the photovoltaic cell matrix is a thin polymer sheet.

12. The method of claim 10, wherein the alternating partitions are welded to the first plate, or welded to the second plate, or welded to the first and second plates.

13. A structure having a plurality of solar panels affixed thereto and generally oriented to face the sun comprising:
    a plurality of solar panels according to claim 1;
    wherein the plurality of solar panels comprises at least a first row of solar panels disposed at a first elevation on the structure and a second row of solar panels disposed at a second elevation on the structure, the second elevation of the second row of panels being lower than the first elevation of the first row of solar panels, the first row of panels each having inlets and outlets and the second row of solar panels each having inlets and outlets;
    wherein the inlets of the first and second rows of panels each have fluid inlet lines in fluid communication with a cold fluid supply line; and
    wherein the outlets of the first and second rows of panels each have fluid outlet lines in communication with a warm fluid return line.

14. The structure of claim 13, wherein the fluid inlet lines are in fluid communication with the cold fluid supply line via an inlet manifold.

15. The structure of claim 13, wherein the fluid outlet lines are in fluid communication with the warm fluid return line via an outlet manifold.

16. The structure of claim 13, further comprising additional rows of panels.

\* \* \* \* \*